(12) United States Patent
Yamamoto et al.

(10) Patent No.: US 11,349,449 B2
(45) Date of Patent: May 31, 2022

(54) LAMINATED ELECTRONIC COMPONENT AND METHOD FOR MANUFACTURING LAMINATED ELECTRONIC COMPONENT

(71) Applicant: Murata Manufacturing Co., Ltd., Kyoto (JP)

(72) Inventors: Issei Yamamoto, Kyoto (JP); Atsunobu Okazaki, Kyoto (JP); Yuki Asano, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/144,559

(22) Filed: Jan. 8, 2021

(65) Prior Publication Data

US 2021/0126608 A1 Apr. 29, 2021

Related U.S. Application Data

(63) Continuation of application No. PCT/JP2019/026906, filed on Jul. 5, 2019.

(30) Foreign Application Priority Data

Jul. 13, 2018 (JP) ............................. JP2018-133407

(51) Int. Cl.
*H03H 7/01* (2006.01)
*H03H 1/00* (2006.01)
*H03H 3/00* (2006.01)

(52) U.S. Cl.
CPC ............ *H03H 7/0115* (2013.01); *H03H 1/00* (2013.01); *H03H 3/00* (2013.01); *H03H 2001/0085* (2013.01)

(58) Field of Classification Search
CPC .................... H03H 2001/0085; H03H 7/0115
USPC ................................................ 333/175, 185
See application file for complete search history.

(56) References Cited

U.S. PATENT DOCUMENTS

| | | | |
|---|---|---|---|
| 2008/0123248 A1 | 5/2008 | Kunishi et al. | |
| 2012/0168214 A1 | 7/2012 | Kashiwagi et al. | |
| 2016/0095267 A1 | 3/2016 | Kitazaki et al. | |
| 2018/0351529 A1* | 12/2018 | Miyahara ................ | H01F 27/00 |

(Continued)

FOREIGN PATENT DOCUMENTS

| | | |
|---|---|---|
| JP | 2007048768 A | 2/2007 |
| JP | 2011159786 A | 8/2011 |

(Continued)

OTHER PUBLICATIONS

International Search Report issued in Application No. PCT/JP2019/026906, dated Sep. 10, 2019.

(Continued)

*Primary Examiner* — Rakesh B Patel
(74) *Attorney, Agent, or Firm* — Pearne & Gordon LLP

(57) ABSTRACT

Provided is a laminated electronic component in which defective formation is unlikely to cause in a shield conductor layer on a side surface of a laminate. The laminated electronic component includes a laminate 1, in which substrate layers 1a to 1i are laminated, having an outer surface including a first main surface 1B, a second main surface 1T, and a side surface 1S, internal electrodes (a ground electrode 2, coil electrodes 3, capacitor electrodes 4, and wiring electrodes 5), an external electrode 7, and a first plating layer 9 formed on a surface of the external electrode 7.

16 Claims, 9 Drawing Sheets

(56) References Cited

U.S. PATENT DOCUMENTS

| | | |
|---|---|---|
| 2019/0043662 A1 | 2/2019 | Yamamoto |
| 2019/0122801 A1* | 4/2019 | Kim .................. H01F 17/0013 |
| 2020/0013729 A1 | 1/2020 | Washida et al. |

FOREIGN PATENT DOCUMENTS

| | | |
|---|---|---|
| JP | 2012165028 A | 8/2012 |
| JP | 2016072411 A | 5/2016 |
| JP | 2019114669 A | 7/2019 |
| WO | 2017179325 A1 | 10/2017 |
| WO | 2018159482 A1 | 9/2018 |
| WO | 2018221131 A1 | 12/2018 |

OTHER PUBLICATIONS

Written Opinion issued in Application No. PCT/JP2019/026906, dated Sep. 10, 2019.

\* cited by examiner

LAMINATED ELECTRONIC COMPONENT AND METHOD FOR MANUFACTURING LAMINATED ELECTRONIC COMPONENT

CROSS REFERENCE TO RELATED APPLICATIONS

This is a continuation of International Application No. PCT/JP2019/026906 filed on Jul. 5, 2019 which claims priority from Japanese Patent Application No. 2018-133407 filed on Jul. 13, 2018. The contents of these applications are incorporated herein by reference in their entireties.

BACKGROUND OF THE DISCLOSURE

Field of the Disclosure

The present disclosure relates to a laminated electronic component having a laminate in which a plurality of substrate layers are laminated, and more particularly, to a laminated electronic component in which a shield conductor layer is formed on an outer surface of a laminate.

The present disclosure also relates to a method for manufacturing a laminated electronic component suitable for manufacturing a laminated electronic component of the present disclosure.

Description of the Related Art

Laminated electronic components may have plating layers on the surfaces of external electrodes in order to prevent oxidation of the surfaces of the external electrodes and to improve solder wettability of the surfaces of the external electrodes. For example, Patent Document 1 (Japanese Patent Application Laid-Open No. 2007-48768) discloses a laminated electronic component in which a plating layer (plating film) is formed on a surface of an external electrode (external terminal).

Meanwhile, electronic devices have become smaller and more sophisticated in recent years, leading to a requirement for high-density mounting of many electronic components on a substrate of an electronic device. The demand for high-density mounting is increasing, and yet higher-density mounting of electronic components on a substrate is desired.

Patent Document 1: Japanese Patent Application Laid-Open No. 2007-48768

BRIEF SUMMARY OF THE DISCLOSURE

When a plurality of electronic components are mounted on a substrate of an electronic device at high density, interference of noise between the electronic components is problematic. That is, there is a problem that noise generated by a certain electronic component enters another adjacent electronic component and adversely affects the electronic component.

Hence, the applicant has considered forming a shield conductor layer on an outer surface of a laminate of a laminated electronic component so that the electronic component does not interfere with another adjacent electronic component despite high-density mounting. That is, it has been considered that the shield conductor layer is formed on the outer surface of the laminate so as not to let in noise from the outside or to let out noise to the outside. In order to ensure the shielding effect, the shield conductor layer is desirably connected to a ground electrode formed inside the laminate with an extended electrode interposed therebetween to have a ground potential. The shield conductor layer may be directly connected to the ground electrode without interposing an extended electrode.

At this time, an end portion of the extended electrode (or an end portion of the ground electrode) is exposed on a side surface of the laminate. Thus, in a step of forming a plating layer on a surface of an external electrode, a plating layer is also formed on the end portion of the extended electrode exposed from the side surface of the laminate. The shield conductor layer is then formed on the outer surface of the laminate including the plating layer. Note that, when the ground electrode and the shield conductor layer are connected via the extended electrode, a conductive paste for forming the extended electrode is applied in a predetermined shape on a main surface of a predetermined ceramic green sheet. Next, ceramic green sheets are stacked, integrated, and fired to produce the laminate. Next, plating layers are formed on the surfaces of external electrodes formed on the outer surface of the laminate.

Here, it is conceivable to change the order of steps such that the step of forming a shield conductor layer comes first and the step of forming plating layers on the surfaces of external electrodes comes later. In this case, however, a plating layer will also be formed on a surface of the shield conductor layer. This results in an increase in cost of the plating material by an amount of the plating layer formed on the surface of the shield conductor layer. Thus, as described above, it is preferable to first form the plating layers on the surfaces of external electrodes and then to form a shield conductor layer.

When manufacturing a laminated electronic component including a shield conductor layer formed on an outer surface of a laminate and an extended electrode for connecting a ground electrode with a shield conductor layer as described above through the above steps without giving any consideration to a relationship between a plating layer formed on an end portion of the extended electrode (or an end portion of the ground electrode) and the shield conductor layer formed on the plating layer, the following problems have occurred.

First, in some cases, in a step of forming a shield conductor layer by sputtering, the plating layer formed on the end portion of the extended electrode exposed on a side surface of the laminate becomes an obstacle and causes defective formation of the shield conductor layer. Sputtering is generally conducted by fixing a laminate, which is a work piece, on a jig and then flying metal atoms from above. At this time, in some cases, a portion where the shield conductor layer is not formed or the thickness of the shield conductor layer formed is insufficient arises on a portion of the side surface of the laminate immediately below the plating layer due to shading by the plating layer formed on the side surface (the end portion of the extended electrode) of the laminate.

In other cases, regardless of presence or absence of defective formation of the shield conductor layer, the plating layer formed on the side surface (the end portion of the extended electrode) of the laminate is pulled by tension of the shield conductor layer after completion, and breaks away from the end portion of the extended electrode. In yet other cases, when a completed laminated electronic component is passed through a parts feeder, an external force (impact, etc.) is applied to the plating layer from the top of the shield conductor layer, and causes breakaway of the plating layer from the end portion of the extended electrode. The breakaway of the plating layer from the end portion of the extended electrode may then cause an insufficient electrical connection between the shield conductor layer and the ground electrode, and deteriorate the shielding function of the shield conductor layer.

The present disclosure has been made to solve the above-mentioned conventional problems. A laminated electronic component according to an embodiment of the present disclosure includes a laminate having an outer surface including a first main surface, a second main surface, and at least one side surface connecting the first main surface and the second main surface, an internal electrode formed inside the laminate, an external electrode formed on the first main surface or the second main surface of the laminate, and a first plating layer formed on a surface of the external electrode. In the laminated electronic component, the internal electrode includes an end portion exposed from the side surface of the laminate, a second plating layer is formed on the side surface of the laminate to cover the end portion of the internal electrode exposed from the side surface of the laminate, a shield conductor layer is formed on the outer surface of the laminate including the side surface on which the second plating layer is formed, and a thickness of the second plating layer is less than a thickness of the shield conductor layer.

A method for manufacturing a laminated electronic component according to an embodiment of the present disclosure, includes a step of preparing ceramic green sheets, a step of forming a through hole for forming a via conductor in a predetermined one of the ceramic green sheets and filling the through hole with a conductive paste, a step of applying a conductive paste in a predetermined shape to form at least one of an internal electrode and an external electrode on a main surface of a predetermined one of the ceramic green sheets, a step of stacking the ceramic green sheets to produce an unfired laminate, a step of firing the unfired laminate with a predetermined profile to produce a laminate having an outer surface including a first main surface, a second main surface, and at least one side surface connecting the first main surface and the second main surface, an internal electrode formed inside, and an external electrode formed on the first main surface or the second main surface, the internal electrode having an end portion exposed to an outside from the side surface, a step of forming a first plating layer on the external electrode and forming a second plating layer on the side surface of the laminate to cover the end portion of the internal electrode exposed from the side surface of the laminate, a step of flattening the second plating layer by a barrel apparatus, and a step of forming a shield conductor layer on a predetermined portion of the outer surface of the laminate including the second plating layer.

In the laminated electronic component of the present disclosure, the plating layer formed on the side surface of the laminate is unlikely to hinder the formation of the shield layer and to cause the defective formation of the shield conductor layer on the side surface of the laminate. Further, in the laminated electronic component of the present disclosure, the plating layer formed on the side surface of the laminate is unlikely to break away from the end portion of the internal electrode.

According to the method for manufacturing a laminated electronic component of the present disclosure, the laminated electronic component of the present disclosure can be easily manufactured.

BRIEF DESCRIPTION OF THE SEVERAL VIEWS OF THE DRAWINGS

FIGS. 6A-1 to 6A-3 are explanatory views of a sample 110 according to a practical example. FIGS. 6B-1 and 6B-2 are explanatory views of a sample 120 according to a comparative example.

DETAILED DESCRIPTION OF THE DISCLOSURE

Figure 1:
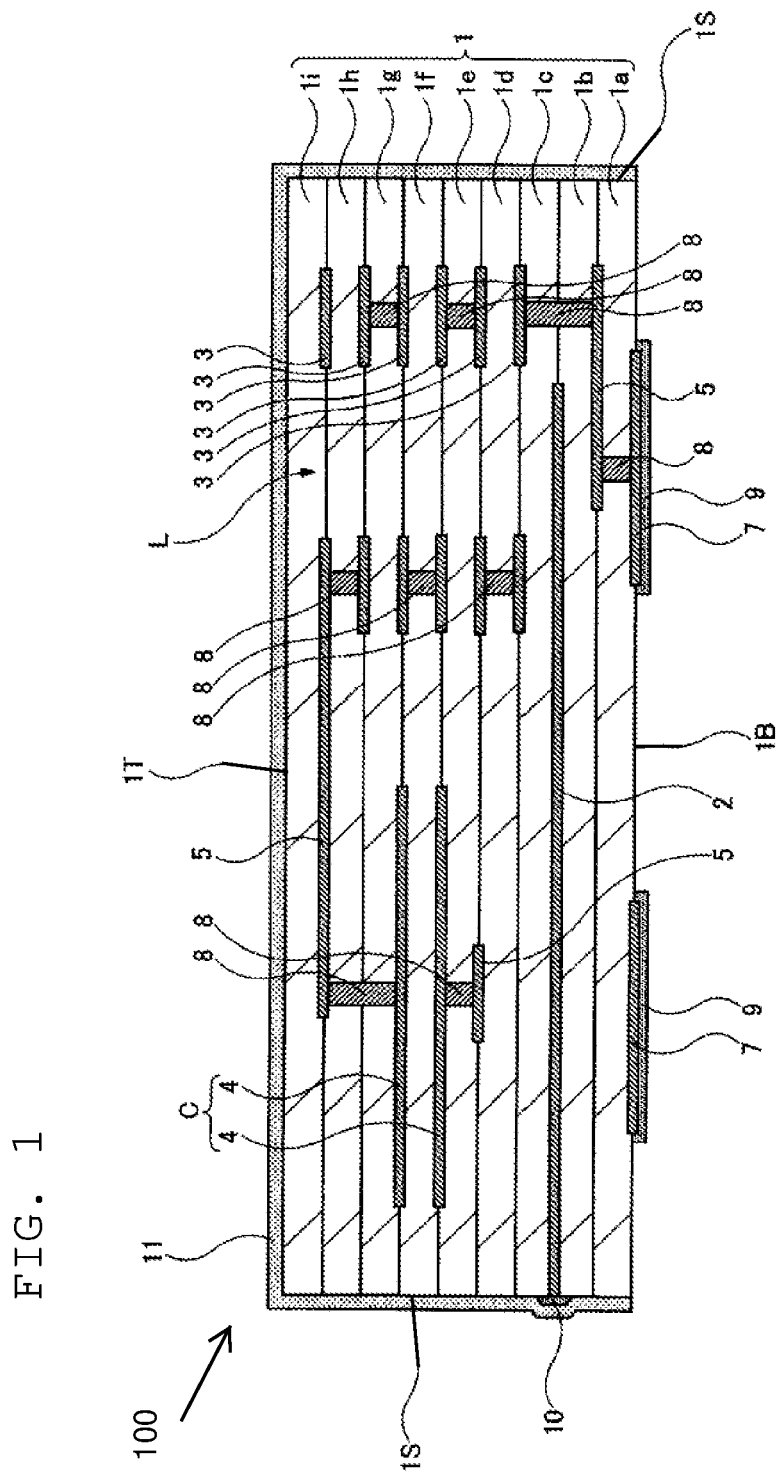
FIG. 1 is a sectional view of a laminated electronic component 100 according to a first embodiment.

Hereinafter, embodiments for carrying out the present disclosure will be described with reference to the drawings.

It should be noted that each embodiment shows an exemplary embodiment of the present disclosure, and does not limit the present disclosure to the contents of the embodiment. It is also feasible to combine the contents described in different embodiments, and the resulting contents are also within the scope of the present disclosure. The drawings are provided for better understanding of the specification. Some figures may be drawn schematically, and a dimensional ratio of a drawn constituent element or between the drawn constituent elements may not match a dimensional ratio of those described in the specification. In addition, some constituent elements described in the specification may be omitted in the drawings, or may be drawn by reducing the number of the elements.

First Embodiment (Structure of Laminated Electronic Component 100)

Figure 2:
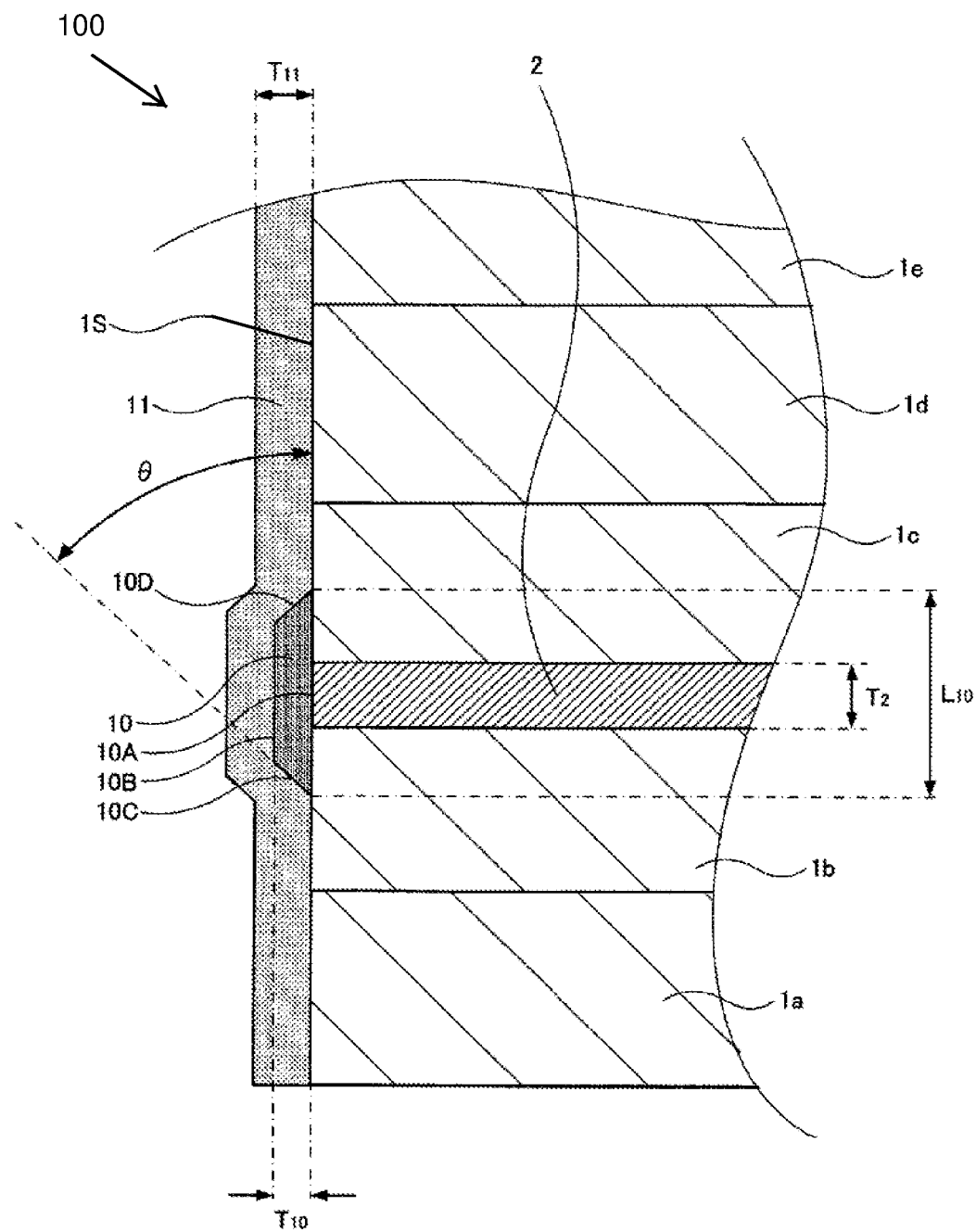
FIG. 2 is a sectional view of a main part of the laminated electronic component 100.

FIGS. 1 and 2 show a laminated electronic component 100 according to a first embodiment. FIG. 1 is a sectional view of the laminated electronic component 100. FIG. 2 is a sectional view of a main part of the laminated electronic component 100.

Figure 3A:
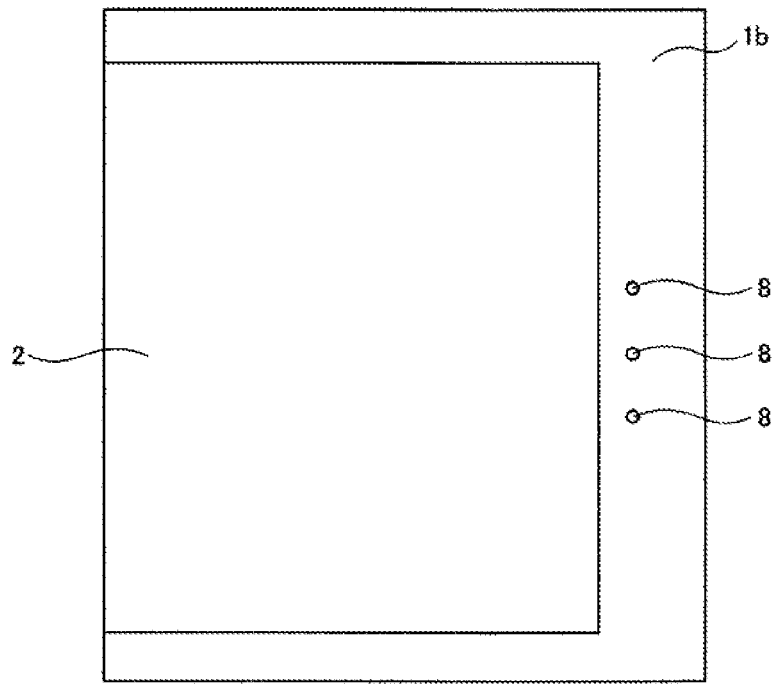
FIG. 3A is a plan view of a substrate layer 1b of the laminated electronic component 100.
Figure 3B:
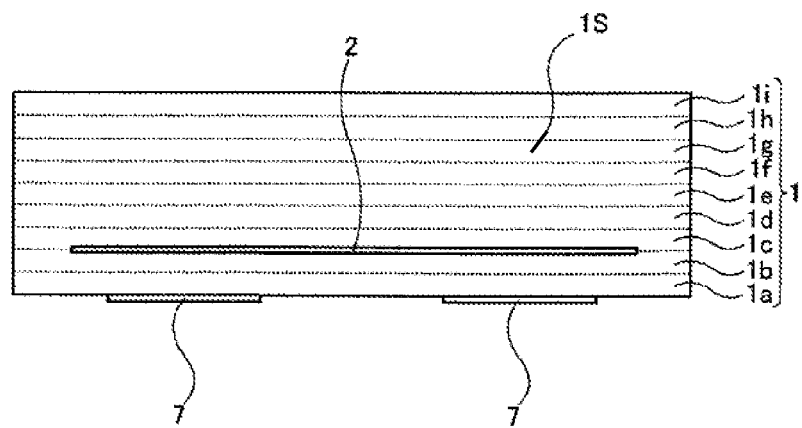
FIG. 3B is a side view of a laminate 1 of the laminated electronic component 100.

Further, FIG. 3A shows a plan view of a substrate layer 1b of the laminated electronic component 100. FIG. 3B shows a side view of a laminate 1 of the laminated electronic component 100. Note, however, that FIG. 3B shows a side surface 1S of the laminate 1 of the laminated electronic component 100 where an end portion of a ground electrode 2 is exposed before first plating layers 9 and a second plating layer 10 are formed.

The laminated electronic component 100 according to the present embodiment is an LC filter in which a coil and a capacitor are formed and a desired circuit is constituted. However, the laminated electronic component of the present disclosure is not limited to an LC filter, and can be various types of electronic components.

The laminated electronic component 100 includes the laminate 1. The laminate 1 is composed of laminated ceramic substrate layers 1a to 1i. The material of the laminate 1 (substrate layers 1a to 1i) is arbitrary, and for example, can be Low Temperature Co-fired Ceramics (LTCC). Further, the number of the substrate layers is arbitrary and can be increased or decreased as appropriate.

The laminate 1 is a rectangular parallelepiped, and has an outer surface consisting of a first main surface 1B which is a mounting surface, a second main surface 1T which is a top surface, and four side surfaces 1S connecting the first main surface 1B and the second main surface 1T. The number of the side surfaces is not limited to four and is arbitrary. For example, when a laminate is cylindrical, it has one side surface.

The laminate 1 inside has the ground electrode 2, coil electrodes 3, capacitor electrodes 4, and wiring electrodes 5 as internal electrodes. The ground electrode 2, the coil electrodes 3, the capacitor electrodes 4, and the wiring electrodes 5 are each formed between predetermined layers of the substrate layers 1a to 1i. The planar shapes, thicknesses, numbers, etc. of the ground electrode 2, the coil electrodes 3, the capacitor electrodes 4, and the wiring electrodes 5 are arbitrary.

As can be seen from FIG. 3A showing an upper main surface of the substrate layer 1b and FIG. 3B showing the side surface 1S of the laminate 1, in the present embodiment, an end portion of the ground electrode 2 (the left end portion in FIG. 3A) is exposed from the side surface 1S of the laminate 1. The end portion of the ground electrode 2 is exposed from the side surface 1S of the laminate 1 so that the ground electrode 2 and a shield conductor layer 11 described later are electrically connected with each other with a second plating layer 10 also described later interposed therebetween. In the present embodiment, the left end portion of the ground electrode 2 in FIG. 3A is exposed from the side surface 1S of the laminate 1, but another end portion of the ground electrode 2, for example, the right end portion in FIG. 3A may also be exposed from a side surface 1S of the laminate 1 at the same time. In this case, an electrical connection between the ground electrode 2 and the shield conductor layer 11 is ensured. Note that, if the right end portion of the ground electrode 2 in FIG. 3A is exposed from the side surface 1S of the laminate 1, it is necessary to form a region having no electrode between the ground electrode 2 and via conductors 8 described later so that they are not short-circuited.

External electrodes 7 are formed on the first main surface 1B of the laminate 1. The planar shapes, thicknesses, number, etc. of the external electrodes 7 are arbitrary.

Each of the substrate layers 1a to 1h has a via conductor 8 formed by penetrating both its main surfaces. The formation positions, numbers, sectional shapes, diameters, etc. of the via conductor 8 in the respective substrate layers 1a to 1h are arbitrary. The via conductors 8 provide necessary connections between the ground electrode 2, the coil electrodes 3, the capacitor electrodes 4, the wiring electrodes 5, and the external electrodes 7.

In the present embodiment, Cu is used as the material of the ground electrode 2, the coil electrodes 3, the capacitor electrodes 4, the wiring electrodes 5, the external electrodes 7, and the via conductors 8. However, the materials of the ground electrode 2, the coil electrodes 3, the capacitor electrodes 4, the wiring electrodes 5, the external electrodes 7, and the via conductors 8 are arbitrary, and for example, Cu alloy, Ag, Ag alloy, etc. may be used instead of Cu.

First plating layers 9 are formed on the surfaces of the external electrodes 7. The first plating layers 9 have a function of preventing the oxidation of the surfaces of the external electrodes 7 and a function of improving the solder wettability of the surfaces of the external electrodes 7. In the present embodiment, the first plating layers 9 are each formed into a two-layer structure consisting of a first layer of Ni and a second layer of Au. Note, however, that the structure (whether it is single-layer or multi-layer, etc.), thicknesses, material, forming method (whether electrolytic plating or electroless plating, etc.), etc. of the first plating layers 9 are arbitrary. For example, a two-layer structure consisting of a first layer of Ni and a second layer of Sn may be employed instead of the two-layer structure of the first layer of Ni and the second layer of Au. In FIGS. 1 and 2, the first plating layers 9 are each shown as a single-layer structure for easy viewing.

Further, a second plating layer 10 is formed on the side surface 1S of the laminate 1 to cover the end portion of the ground electrode 2 exposed from the side surface 1S of the laminate 1. The second plating layer 10 is formed at the same time as the first plating layers 9, and has a two-layer structure consisting of a first layer of Ni and a second layer of Au in the same way as the first plating layers 9. Note, however, that the structure (whether it is single-layer or multi-layer, etc.), thickness, material, forming method (whether electrolytic plating or electroless plating, etc.), etc. of the second plating layer 10 are arbitrary. For example, a two-layer structure consisting of a first layer of Ni and a second layer of Sn may be employed instead of the two-layer structure of the first layer of Ni and the second layer of Au. In FIGS. 1 and 2, the second plating layer 10 is shown as a single-layer structure for easy viewing.

The first plating layers 9 and the second plating layer 10 are flattened after being formed. Specifically, the laminate 1 after the first plating layers 9 and the second plating layer 10 are formed is housed in a pot of a rotary barrel apparatus together with media, and is rotated at a predetermined rotation speed for a predetermined time for the flattening process. The flattening process by the barrel apparatus is preferable to a flattening process by blasting because the outer surface of the laminate 1 is unlikely to be damaged.

It is preferable that the first plating layers 9 and the second plating layer 10 each have a total thickness of about 1 µm or more and 10 µm or less before the flattening process. This is because, if the respective total thicknesses of the first plating layers 9 and the second plating layer 10 are less than 1 µm, there is a risk that the flattening process may cause the plating layers to have a thin portion or an opening that deteriorates the coverage. If the respective total thicknesses of the first plating layers 9 and the second plating layer 10 exceed 10 µm, an excessive amount of the plating material more than necessary is used, which increases the cost.

As shown in FIG. 2, a section of the second plating layer 10 after the flattening process is a quadrilateral of which the outer edge consists of an inner side 10A in contact with the side surface 1S of the laminate 1, an outer side 10B opposite to the inner side 10A, and a first connecting side 10C and a second connecting side 10D connecting the inner side 10A with the outer side 10B.

The flattening process by the barrel apparatus makes the second plating layer 10 stretched in a plane direction (a direction in which the side surface 1S of the laminate 1 spreads), reduced in thickness, and anchored in the side surface 1S of the laminate 1 due to the anchor effect. Therefore, the second plating layer 10 is strongly bonded to the side surface 1S of the laminate 1.

Further, the flattening process by the barrel apparatus makes the interior angles of the second plating layer 10 between the inner side 10A and the first connecting side 10C and between the inner side 10A and the second connecting side 10D smaller. That is, when a thickness direction of the second plating layer is a direction in which the ground electrode 2 extends, the second plating layer has a tapered shape tapering outward in the thickness direction. Note that the interior angle between the inner side 10A and the first connecting side 10C and the interior angle between the inner side 10A and the second connecting side 10D are almost the same size, and both are thus represented by a reference symbol θ. In FIG. 2, the interior angle θ between the inner side 10A and the first connecting side 10C is indicated by an arrow.

As described above, the flattening process makes the second plating layer 10 stretched in the plane direction, reduced in thickness, and anchored in the side surface 1S of the laminate 1 due to the anchor effect, and further, makes the interior angle θ between the inner side 10A and the first connecting side 10C and the interior angle θ between the inner side 10A and the second connecting side 10D smaller. Accordingly, it is preferable that the second plating layer 10 includes at least one layer made of highly malleable metal such as Au and Sn.

If bondability between the ground electrode 2 and the shield conductor layer 11 described later is low due to material compatibility, the second plating layer 10 may serve as an intermediate material for bonding them with high bondability. For example, if the ground electrode 2 is made of Ag and a bottom layer of the shield conductor layer 11 is made of Steel Use Stainless (SUS), direct bonding of them results in low bondability. However, for example, by forming the second plating layer 10 consisting of a first layer of Ti and a second layer of Au as an intermediate material between the ground electrode 2 and the shield conductor layer 11, they are bonded with high bonding strength in the order.

The shield conductor layer 11 is formed on the outer surface of the laminate 1 including the side surface 1S on which the second plating layer 10 is formed. In the present embodiment, the shield conductor layer 11 is formed on the second main surface 1T and the four side surfaces 1S of the laminate 1. Note that the shield conductor layer 11 needs to be formed on the second plating layer 10, but may be formed in any region of the outer surface of the laminate 1 if that condition is satisfied. However, the wider the region of the outer surface of the laminate 1 covered with the shield conductor layer 11 is, the better the shielding effect is.

In the present embodiment, the shield conductor layer 11 is formed into a three-layer structure consisting of an SUS adhesive layer, a Cu conductive layer, and an SUS corrosion-resistant layer by sputtering. However, the structure (whether it is single-layer or multi-layer, etc.), thickness, material, forming method, etc. of the shield conductor layer 11 are arbitrary. For example, as the adhesive layer, Ti, Cr, Ni, TiAl, or the like may be used instead of SUS. As the conductive layer, Ag, Au, or the like may be used instead of Cu. As the corrosion-resistant layer, Ti, Cr, Ni, TiAl, or the like may be used instead of SUS. In FIGS. 1 and 2, the shield conductor layer 11 is shown as a single-layer structure for easy viewing.

In the laminated electronic component 100 having the above structure, a plurality of the coil electrodes 3 are connected in a spiral manner with via conductors 8 to form a coil L, the capacitor electrodes 4 generate capacitance therebetween to form a capacitor C, and the coil L and the capacitor C constitute the LC filter.

The laminated electronic component 100 according to the present embodiment has a high shielding effect since the shield conductor layer 11 with a ground potential is formed by being connected to the ground electrode 2 via the second plating layer 10. That is, noise is unlikely to enter the laminated electronic component 100 from the outside and is unlikely to be radiated from the laminated electronic component 100 to the outside.

Further, the second plating layer 10 of the laminated electronic component 100 is reduced in thickness by being flattened by the barrel apparatus. As shown in FIG. 2, the thickness $T_{10}$ of the second plating layer 10 is less than the thickness $T_{11}$ of the shield conductor layer 11. Therefore, in the laminated electronic component 100, when forming the shield conductor layer 11 by sputtering, the second plating layer 10 is unlikely to become an obstacle and to cause the defective formation of the shield conductor layer 11. Further, in the laminated electronic component 100, the second plating layer 10 is unlikely to be hit by other objects (from the top of the shield conductor layer 11) and to break away from the end portion of the ground electrode 2 after completion since the thickness of the second plating layer 10 is small. In order to prevent the second plating layer 10 from hindering the formation of the shield conductor layer 11 and breaking away from the end portion of the ground electrode 2 after completion, it is preferable that the thickness $T_{10}$ of the second plating layer 10 after the flattening process is, if possible, ½ or less of the thickness $T_{11}$ of the shield conductor layer 11.

Further, the second plating layer 10 of the laminated electronic component 100 is stretched in the plane direction and anchored in the side surface 1S of the laminate 1 due to the anchor effect by being flattened by the barrel apparatus. As shown in FIG. 2, the length $L_{10}$ of the inner side 10A of the second plating layer 10 is more than the thickness $T_2$ of the ground electrode 2. In the present embodiment, the length $L_{10}$ of the inner side 10A of the second plating layer 10 is about 3.0 times the thickness $T_2$ of the ground electrode 2. In the laminated electronic component 100, the second plating layer 10 is strongly bonded to the side surface 1S of the laminate 1 (including the end portion of the ground electrode 2) since the length $L_{10}$ of the inner side 10A of the second plating layer 10 is more than the thickness $T_2$ of the ground electrode 2. In order to improve the bonding strength between the second plating layer 10 and the side surface 1S of the laminate 1, it is preferable that the length $L_{10}$ of the inner side 10A of the second plating layer 10 exceeds 1.5 times the thickness $T_2$ of the ground electrode 2.

Further, in the laminated electronic component 100, the interior angle θ between the inner side 10A and the first connecting side 10C and the interior angle θ between the inner side 10A and the second connecting side 10D of the second plating layer 10 are reduced by the flattening process performed on the second plating layer 10 by the barrel apparatus. Therefore, the second plating layer 10 of the laminated electronic component 100 is unlikely to hinder the formation of the shield conductor layer 11 and to cause the defective formation of the shield conductor layer 11 on the side surface 1S of the laminate 1. As shown in FIG. 2, in the present embodiment, the interior angle θ between the inner side 10A and the first connecting side 10C (the second connecting side 10D) of the second plating layer 10 is about 55°. The smaller the interior angle θ between the inner side 10A and the first connecting side 10C (the second connecting side 10D) is, the more unlikely the second plating layer 10 is to hinder the formation of the shield conductor layer 11 and to cause the defective formation of the shield conductor layer 11. In order to prevent the second plating layer 10 from hindering the formation of the shield conductor layer 11 and causing the defective formation of the shield conductor layer 11, the interior angle θ between the inner side 10A and the first connecting side 10C (the second connecting side 10D) is preferably smaller than 90°, more preferably smaller than 60°.

(Example of Method for Manufacturing Laminated Electronic Component 100)

The laminated electronic component 100 can be manufactured, for example, by a following method.

Figure 4A:
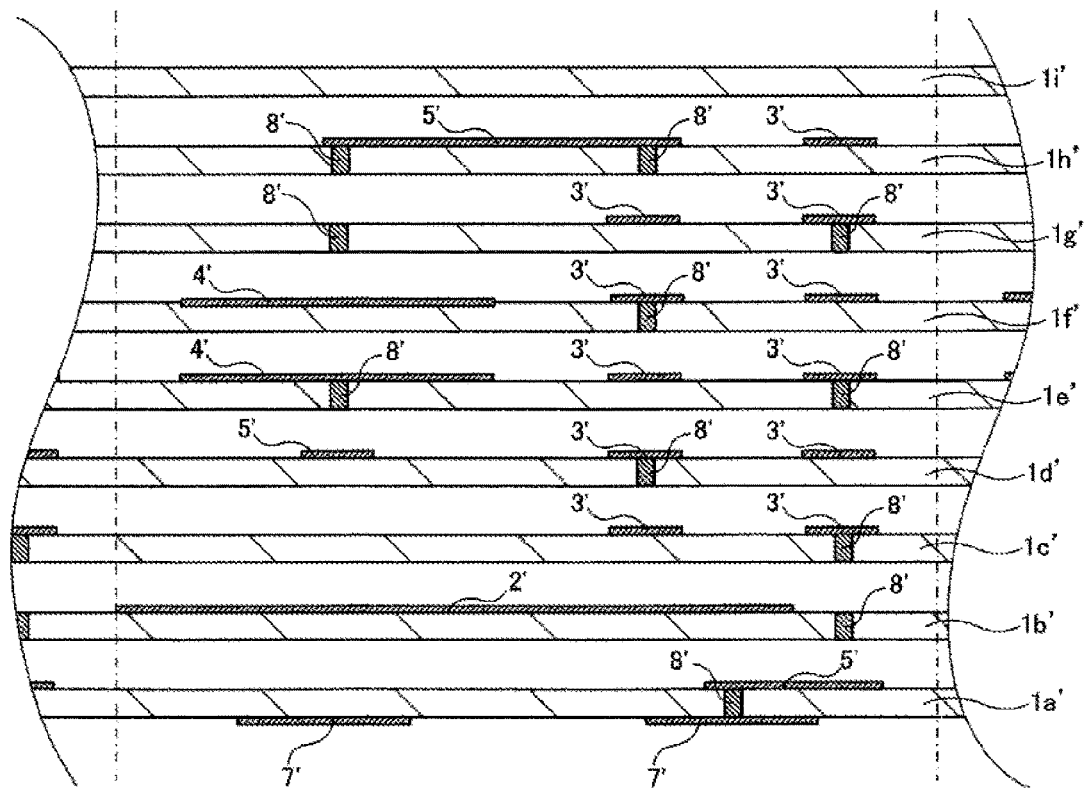
FIGS. 4A and 4B are sectional views showing steps carried out in an example of a method for manufacturing the laminated electronic component 100.

First, as shown in FIG. 4A, ceramic green sheets 1a' to 1i' for forming the ceramic substrate layers 1a to 1i are produced. Specifically, first, a ceramic powder made of LTCC, for example, a binder, and a plasticizer are mixed in arbitrary amounts to produce slurry. Next, the slurry is applied on carrier films by using a lip coater, a doctor blade, or the like to produce the ceramic green sheets 1a' to 1i'. The thicknesses of the ceramic green sheets 1a' to 1i' are arbitrary, but for example, 5 µm to 100 µm. The ceramic green sheets 1a' to 1i' are each prepared as a mother ceramic green sheet in which a plurality of ceramic green sheets 1a' to 1i' are arranged in a matrix, respectively.

Next, as also shown in FIG. 4A, through holes for forming the via conductors 8 are formed at predetermined positions of predetermined ones of the ceramic green sheets 1a' to 1i', and are filled with a conductive paste 8' produced by mixing a conductive powder, a binder and a plasticizer. The through holes are formed by using, for example, a mechanical punch, a $CO_2$ laser, a UV laser, or the like. The through holes have a diameter of, for example, 20 µm to 200 µm. A common base material (ceramic powder) for adjusting a shrinkage rate may be added to the conductive paste.

Next, as also shown in FIG. 4A, conductive pastes 2' to 7' each produced by mixing a conductive powder, a binder, and a plasticizer are applied in predetermined shapes to predetermined positions of main surfaces of predetermined ones of the ceramic green sheets 1a' to 1i' for forming the ground electrode 2, the coil electrodes 3, the capacitor electrodes 4, the wiring electrodes 5, and the external electrodes 7. The application can be performed by, for example, screen printing, ink-jet printing, gravure printing, or the like. A common base material (ceramic powder) for adjusting a shrinkage rate may be added to the conductive paste.

Next, mother ceramic green sheets each having the corresponding one of a plurality of ceramic green sheets 1a' to 1i' arranged in a matrix are stacked in a predetermined order, and pressed and heated using a mold for integration to produce an unfired ceramic block. Subsequently, the unfired ceramic block is cut and separated into individual unfired laminates. The cutting can be performed by, for example, using a dicer, guillotine cutting, laser irradiation, or the like. At this time, the separation is performed so that the ground electrode 2 is exposed from a cut surface. After the cutting, barrel polishing is performed on the unfired laminates as appropriate.

Figure 4B:
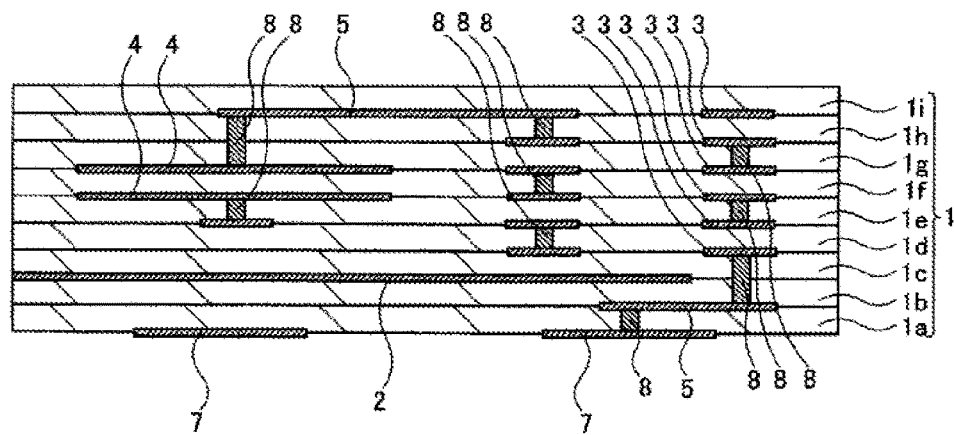

Next, as shown in FIG. 4B, an unfired laminate is fired with a predetermined profile to produce the laminate 1. As a firing furnace, a batch furnace, a belt furnace, or the like can be used. A firing atmosphere differs depending on a conductive paste used, and when a Cu-based conductive paste is used, firing is performed under a reducing atmosphere.

Figure 5C:
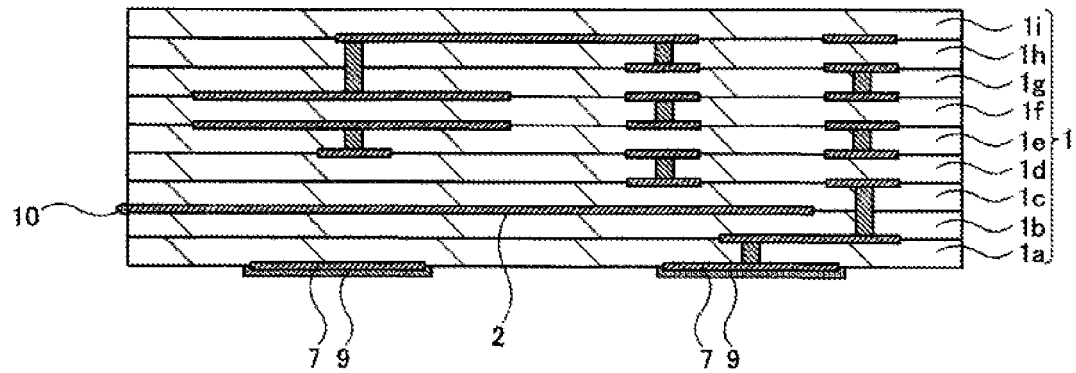
FIGS. 5C to 5E are sectional views following FIG. 4B showing steps carried out in the example of the method for manufacturing the laminated electronic component 100.

Next, as shown in FIG. 5C, the first plating layers 9 are formed on the surfaces of the external electrodes 7, and the second plating layer 10 is formed on the end portion of the ground electrode 2 exposed from the side surface 1S of the laminate 1. It is preferable that the first plating layers 9 and the second plating layer 10 each have a total thickness of about 1 µm or more and 10 µm or less. This is because, if the total thickness is less than 1 µm, there is a risk that the flattening process may yield a thin portion or an opening that deteriorates the coverage. Further, if the total thickness exceeds 10 µm, the cost of the plating material increases.

Figure 5D:
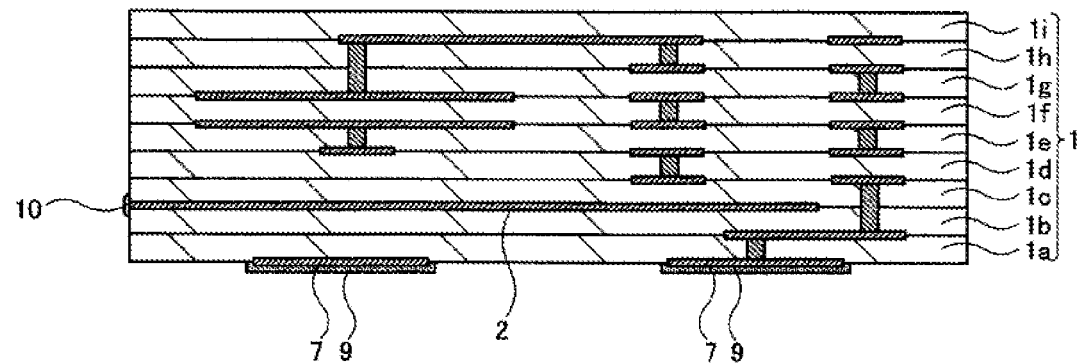

Next, as shown in FIG. 5D, the flattening process by the rotary barrel apparatus is performed to make the second plating layer 10 stretched in the plane direction (the direction in which the side surface 1S of the laminate 1 spreads), reduced in thickness, and anchored in the side surface 1S of the laminate 1 due to the anchor effect. Specifically, the laminate 1 on which the first plating layers 9 and the second plating layer 10 are formed is housed in the pot together with the media. An inside of the pot is preferably coated with rubber for preventing cracking and chipping. The media can be made of, for example, zirconia or alumina. The diameters of the media are arbitrary, and for example, can be about φ2 mm to φ5 mm. The rotation speed and processing time of the rotary barrel apparatus are arbitrary, and for example, can be 50 rpm to 200 rpm and 5 minutes to 30 minutes, respectively. A vibrating barrel apparatus may be used instead of the rotary barrel apparatus.

Figure 5E:
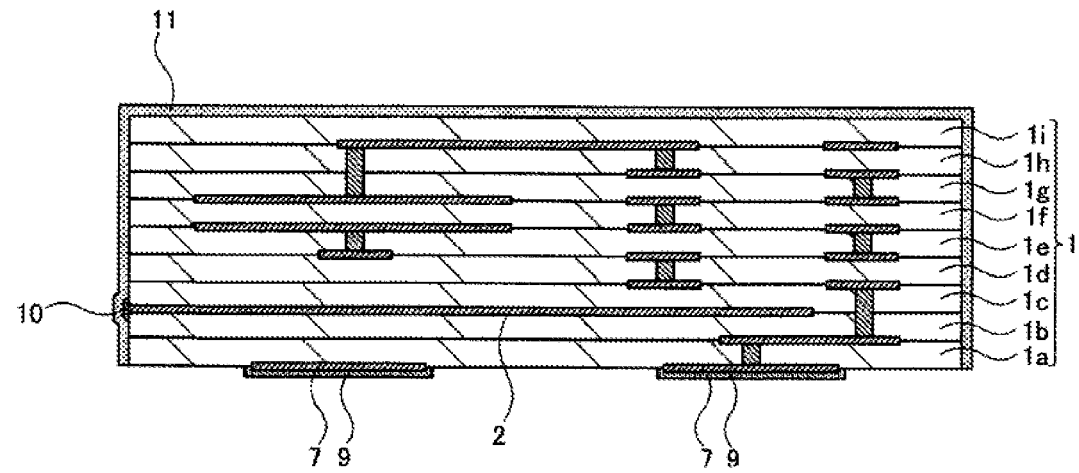

Next, as shown in FIG. 5E, the shield conductor layer 11 is formed on a predetermined portion of the outer surface of the laminate 1 including the second plating layer 10. Specifically, a plurality of laminates 1 of which second plating layers 10 have been flattened by the barrel apparatus 10 are arranged on a tray for sputtering. Paste or tape may be applied on the first main surfaces 1B of the laminates 1 to prevent sputtering on the first main surfaces 1B of the laminates 1. An interval between the laminates 1 is arbitrary, but for example, about 0.5 mm to 5 mm. As a sputtering apparatus, for example, an in-line type, a batch type, or a single-wafer type can be used. Before sputtering, dry etching is performed as appropriate. Dry etching has, in addition to a cleaning effect, an effect of roughening the outer surface of the laminate 1 and strongly bonding the shield conductor layer 11 and the outer surface of the high laminate 1 by the anchor effect.

In the present embodiment, the shield conductor layer 11 is formed into a three-layer structure consisting of an SUS adhesive layer, a Cu conductive layer, and an SUS corrosion-resistant layer by sputtering. The film thickness of the adhesive layer is arbitrary, but for example, 0.01 µm to 0.5 µm on the side surface 1S of the laminate 1. As the adhesive layer, Ti, Cr, Ni, TiAl, Permalloy, or the like may be used instead of SUS. The film thickness of the conductive layer is arbitrary, but for example, 0.9 µm to 3 µm on the side surface 1S of the laminate 1. As the conductive layer, Ag, Au, or the like may be used instead of Cu. The film thickness of the corrosion-resistant layer is arbitrary, but for example, 0.03 µm to 1.5 µm on the side surface 1S of the laminate 1. As the corrosion-resistant layer, Ti, Cr, Ni, TiAl, Permalloy, or the like may be used instead of SUS. When a material having a high magnetic permeability such as Ni and Permalloy is used instead of SUS as the adhesive layer or the corrosion-resistant layer, an effect of shielding a magnetic field of the material improves an electromagnetic shielding effect of the shield conductor layer 11 as a whole.

Through the above steps, the laminated electronic component 100 is completed.

The laminated electronic component 100 is designed so that the thickness of the second plating layer 10 after being flattened by the barrel apparatus is less than the thickness of the shield conductor layer 11. Therefore, when forming the shield conductor layer 11 by sputtering, the second plating layer 10 does not become an obstacle or cause the defective formation of the shield conductor layer 11.

(Experiment)

In order to confirm the effectiveness of the present disclosure, the following experiment was conducted.

Figures 1, 6A:
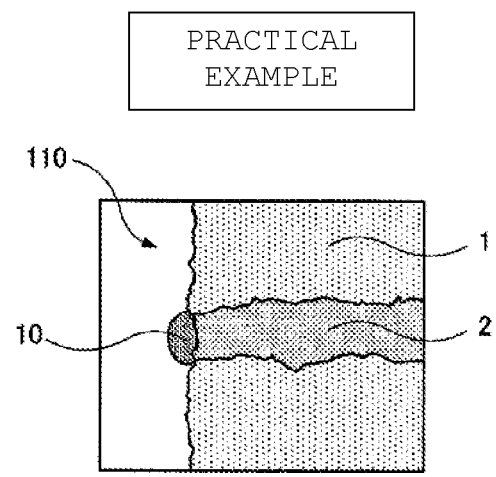
Figures 2, 6A:
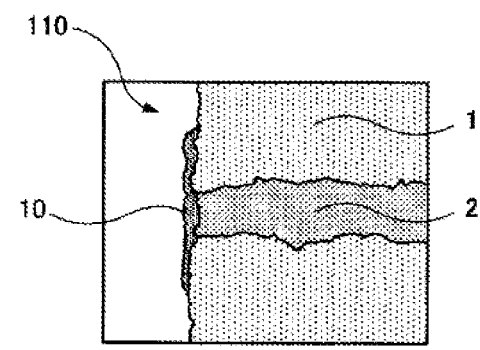
Figures 3, 6A:
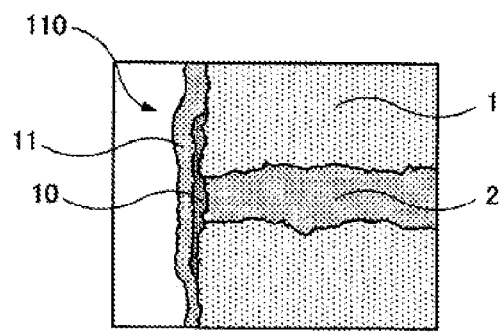

As a practical example, a sample 110 shown in FIG. 6A-3 was produced. As a comparative example, a sample 120 shown in FIG. 6B-2 was produced.

Figures 1, 6B:
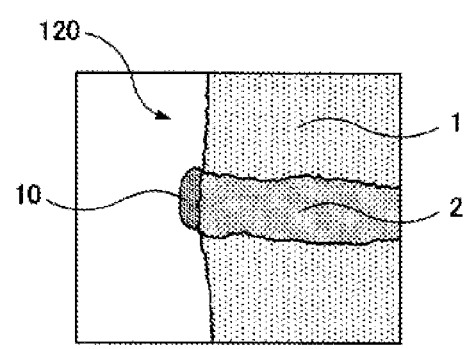
Figures 2, 6B:
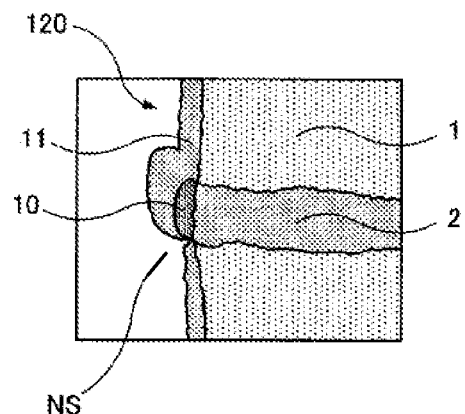

Each of the sample 110 according to the practical example and the sample 120 according to the comparative example was produced through the same steps as shown in the above example of the method for manufacturing a laminated electronic component 100 until a laminate 1 was produced by firing and a second plating layer 10 was formed at an end portion of a ground electrode 2 exposed on a side surface of the laminate 1. FIG. 6A-1 shows the sample 110 after the second plating layer 10 was formed on the side surface of the laminate 1, and FIG. 6B-1 shows the sample 120 after the second plating layer 10 was formed on the side surface of the laminate 1. The thicknesses of the second plating layers 10 of the sample 110 and the sample 120 were each about 3 to 5 µm as measured from the side surface of the laminate 1. In the sample 110 and the sample 120, Au was used as the material of the second plating layers 10.

Next, as shown in FIG. 6A-2, the second plating layer 10 only of the sample 110 according to the practical example was flattened by a rotary barrel apparatus. The flattening process made the thickness of the second plating layer 10 of the sample 110 reduced to about 1 µm as measured from the side surface of the laminate 1.

Next, as shown in FIGS. 6A-3 and 6B-2, a shield conductor layer 11 was formed on each of the sample 110 according to the practical example and the sample 120 according to the comparative example. The shield conductor layer 11 had a three-layer structure consisting of an SUS adhesive layer, a Cu conductive layer, and an SUS corrosion-resistant layer, and the total thickness of the three layers was about 2.5 µm.

In the sample 110 according to the practical example, since the thickness of the second plating layer 10 after flattening was about 1 µm and less than the total thickness of the shield conductor layer 11 which was about 2.5 µm, the shield conductor layer 11 was successfully formed on the side surface of the laminate 1 as can be seen from FIG. 6A-3.

On the other hand, in the sample 120 according to the comparative example, since the thickness of the second plating layer 10 was about 3 to 5 µm and more than the total thickness of the shield conductor layer 11 which was about 2.5 µm, the second plating layer 10 became an obstacle (shadow) when forming the shield conductor layer 11 by sputtering, and as shown in FIG. 6(B-2), an unformed part NS where the shield conductor layer 11 was not formed appeared on the lower portion of the second plating layer 10 on the side surface of the laminate 1. That is, in the sample 120 according to the comparative example, the defective formation happened in the shield conductor layer 11.

From the above, the effectiveness of the present disclosure has been confirmed.

Second Embodiment

Figure 7:
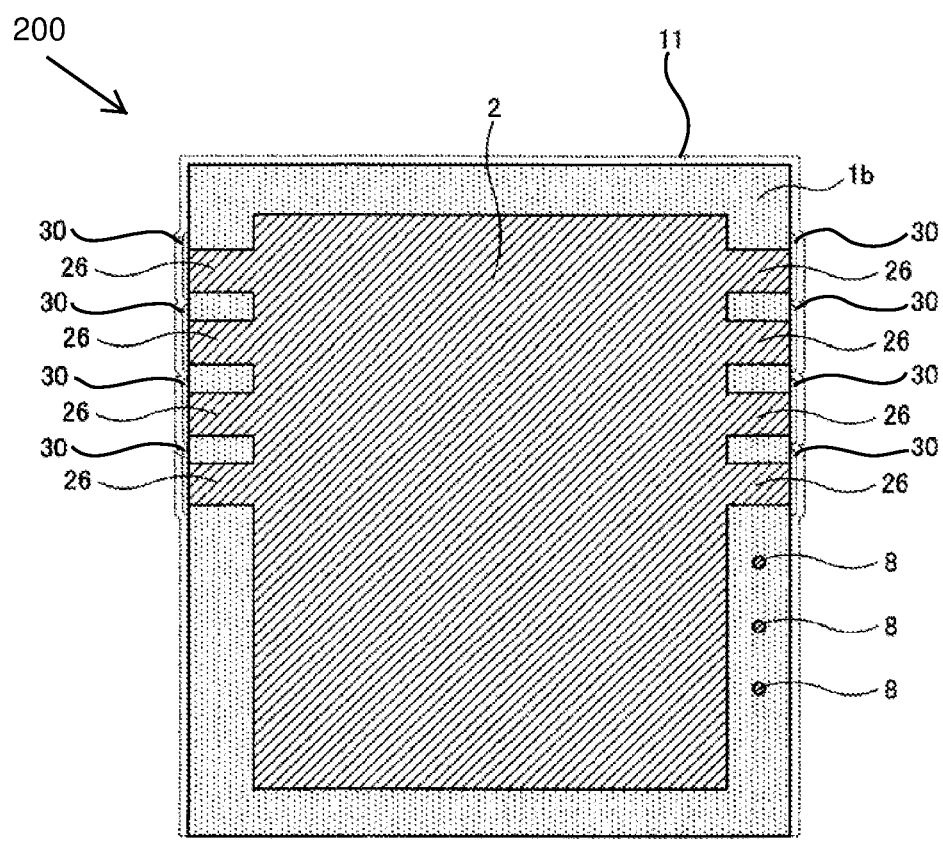
FIG. 7 is a sectional view of a laminated electronic component 200 according to a second embodiment.

FIG. 7 shows a laminated electronic component 200 according to a second embodiment. Note, however, that FIG. 7 is a sectional view of the laminated electronic component 200, and shows a substrate layer 1b side of a boundary surface between a substrate layer 1b and a substrate layer 1c. In FIG. 7, second plating layers 30 and a shield conductor layer 11 are simply drawn and indicated by the broken lines for easy viewing.

Figure 8A:
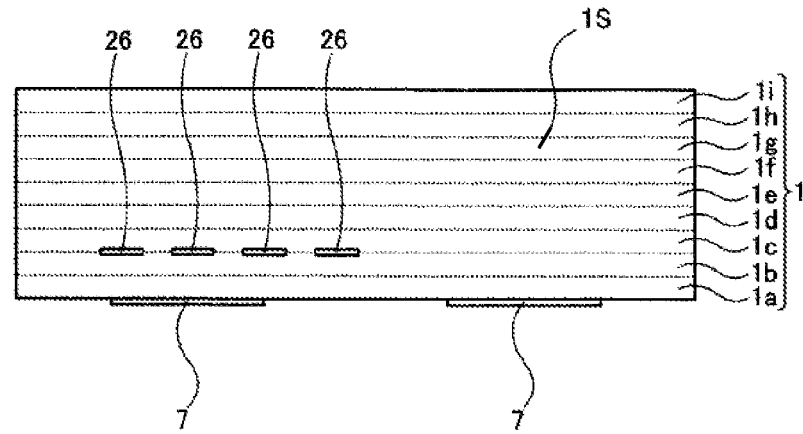
FIGS. 8A to 8C are side views of a laminate 1 of the laminated electronic component 200.
Figure 8B:
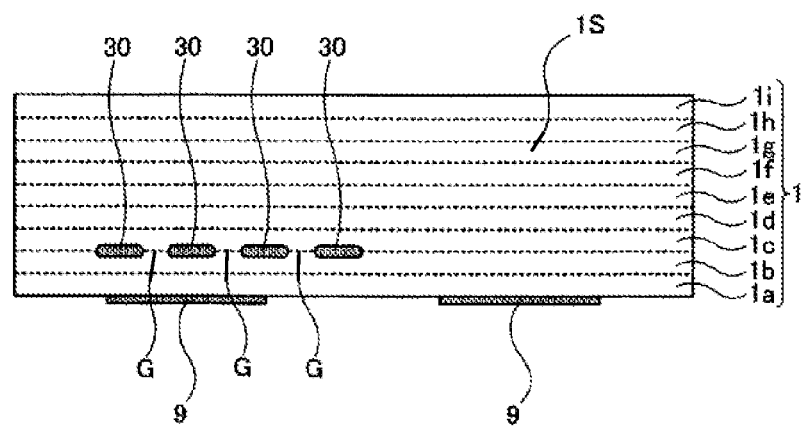
Figure 8C:
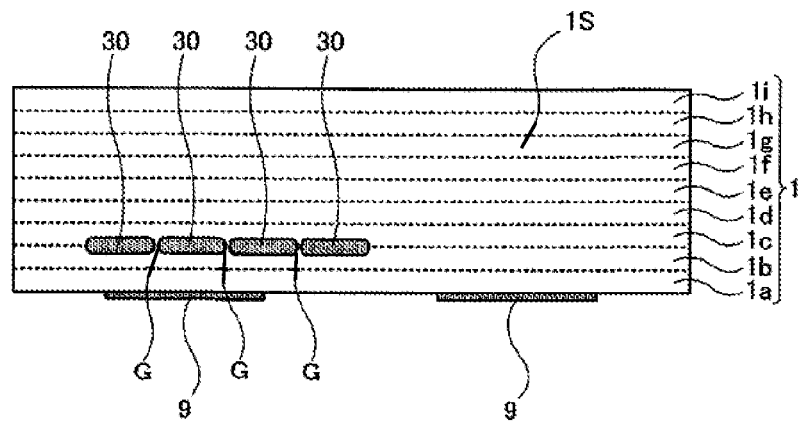

Further, FIGS. 8A to 8C each show a side view of a laminate 1 of the laminated electronic component 200. FIG. 8A shows a state before second plating layers 30 are formed on the end portions of extended electrodes 26, FIG. 8B shows a state after the second plating layers 30 are formed, and FIG. 8C shows a state after the second plating layers 30 are flattened.

The laminated electronic component 200 is obtained by modifying a part of the configuration of the laminated electronic component 100 according to the first embodiment. Specifically, in the laminated electronic component 100, the end portion of the ground electrode 2 is exposed from the side surface 1S of the laminate 1, and the second plating layer 10 is formed on the end portion of the ground electrode 2. In the laminated electronic component 200, which is a modification of this, eight extended electrodes 26 are extended from the ground electrode 2, and have the end portions exposed from the side surfaces 1S of the laminate 1, instead of exposing the end portion of the ground electrode 2 directly from the side surface 1S of the laminate 1. That is, a plurality of end portions of extended electrodes are provided. Then, the second plating layers 30 are formed on the end portions of the extended electrodes 26 exposed from the side surfaces 1S of the laminate 1. In FIG. 7, a plurality of the end portions of the extended electrodes are provided on a portion of the side surfaces 1S, but may be provided over the entire side surfaces 1S.

The extended electrodes 26 are a kind of internal electrode.

The other parts of the laminated electronic component 200 are the same as those of the laminated electronic component 100 according to the first embodiment.

As shown in FIG. 8A, four end portions of extended electrodes 26 are exposed from a side surface 1S of the laminate 1 between a substrate layer 1b and a substrate layer 1c. Then, as shown in FIG. 8B, the second plating layers 30 are formed on the exposed end portions of the extended electrodes 26. Then, as shown in FIG. 8C, the second plating layers 30 are flattened.

As shown in FIG. 8B, the laminated electronic component 200 has intervals G between the second plating layers 30. Thus, in the flattening process of the second plating layers 30, as shown in FIG. 8C, adjacent second plating layers 30 do not interfere with each other, the intervals G are maintained, and the flattening process is performed successfully. That is, in the laminated electronic component 200, each of the second plating layers 30 is stretched not only in a laminating direction of substrate layers 1a to 1i but also in a plane direction of the substrate layers 1a to 1i, resulting in the successful flattening process.

The laminated electronic component 100 according to the first embodiment and the laminated electronic component 200 according to the second embodiment have been described above. However, the present disclosure is not limited to the above description, and various modifications can be made in accordance with the spirit of the disclosure.

For example, in the laminated electronic components 100 and 200, the shield conductor layers 11 are formed by sputtering. However, a forming method of the shield conductor layers 11 is not limited to sputtering, and other methods such as vapor deposition may be employed.

Further, the laminated electronic components 100 and 200 are LC filters each in which the coil L and the capacitor C are composed of the internal electrodes. However, electronic components to be configured are not limited to LC filters, and can be various types of electronic components.

Furthermore, in the laminated electronic component 100, the end portion of the ground electrode 2 is exposed from the side surface 1S of the laminate 1, and the second plating layer 10 is formed on the end portion of the ground electrode 2. In the laminated electronic component 200, the end portions of the extended electrodes 26 are exposed from the side surfaces 1S of the laminate 1, and the second plating layers 30 are formed on the end portions of the extended electrodes 26. However, internal electrodes exposed on the side surfaces 1S of the laminate 1 are not limited to the ground electrode 2 or the extended electrodes 26. The end portions of the coil electrodes 3, the end portions of the capacitor electrodes 4, and the like may be exposed from the side surfaces 1S of the laminate 1, and the second plating layers may be formed on the end portions.

The laminated electronic component according to an embodiment of the present disclosure is as described in "BRIEF SUMMARY OF THE DISCLOSURE". In this laminated electronic component, when viewing a section of the laminate divided in a laminating direction of the substrate layers, the section including an exposed portion of the internal electrode on the side surface of the laminate, the second plating layer has an inner side in contact with the side surface of the laminate and a length of the inner side may be more than a thickness of the internal electrode. In this case, the bonding strength between the second plating layer and the side surface of the laminate is enhanced.

Further, in this case, the length of the inner side may be 1.5 times or more the thickness of the internal electrode. In this case, the bonding strength between the second plating layer and the side surface of the laminate is further enhanced.

When viewing a section of the laminate divided in a laminating direction of the substrate layers, the section including an exposed portion of the internal electrode on the side surface of the laminate, an outer edge of a section of the second plating layer includes an inner side in contact with the side surface of the laminate, an outer side opposite to the inner side, and a first connecting side and a second connecting side connecting the inner side with the outer side, and an interior angle formed by the inner side and the first connecting side and an interior angle formed by the inner side and the second connecting side may each be smaller than 90°. In this case, for example, when forming the shield conductor layer by sputtering, the second plating layer is unlikely to become an obstacle, and a portion where the shield conductor layer is not formed and a portion where the thickness of the shield conductor layer formed is insufficient are unlikely to arise on a portion of the side surface of the laminate immediately below the second plating layer.

Further, in this case, the interior angle formed by the inner side and the first connecting side, and the interior angle formed by the inner side and the second connecting side may each be smaller than 60°. In this case, the second plating layer is more unlikely to be an obstacle, and a portion where the shield conductor layer is not formed and a portion where the thickness of the shield conductor layer formed is insufficient are more unlikely to arise on a portion of the side surface of the laminate immediately below the second plating layer.

Further, the laminated electronic component may include an extended electrode having one end connected to the internal electrode and another end exposed from the side surface of the laminate. Note that the extended electrode is also a kind of internal electrode.

Further, a ground electrode may be the internal electrode. In this case, the shield conductor layer can have a ground potential, and thus the shielding effect can be improved.

Further, the internal electrode may have a plurality of end portions exposed from the side surface. In this case, an electrical connection between the internal electrode and the shield conductor layer is ensured.

Further, the second plating layer may be formed of a plurality of layers. In this case, the second plating layer can have high functionality.

Further, the shield conductor layer may be formed of a plurality of layers. In this case, the shield conductor layer can have high functionality.

For example, a coil and a capacitor can be formed inside the laminate to constitute an LC filter.

The method for manufacturing a laminated electronic component according to an embodiment of the present disclosure is as described in "BRIEF SUMMARY OF THE DISCLOSURE". In this method for manufacturing a laminated electronic component, the step of forming the shield conductor layer may be a step of sputtering on a predetermined portion of the outer surface of the laminate. In this case, the shield conductor layer can be superior in quality.

1: Laminate
1B: First main surface (mounting surface)
1T: Second main surface (top surface)
1S: Side surface
1a to 1i: Substrate layer
2: Ground electrode (internal electrode)
3: Coil electrode (internal electrode)
4: Capacitor electrode (internal electrode)
5: Wiring electrode (internal electrode)
7: External electrode
8: Via conductor
9: First plating layer
10, 30: Second plating layer
10A: Inner side
10B: Outer side
10C: First connecting side
10D: Second connecting side
11: Shield conductor layer
26: Extended electrode (internal electrode)

The invention claimed is:

1. A laminated electronic component comprising:
   a laminate having an outer surface including a first main surface, a second main surface, and at least one side surface connecting the first main surface and the second main surface;
   an internal electrode provided inside the laminate;
   an external electrode provided on the first main surface or the second main surface of the laminate; and
   a first plating layer provided on a surface of the external electrode, wherein
   the internal electrode has an end portion exposed from the side surface of the laminate,
   a second plating layer is provided on the side surface of the laminate to cover the end portion of the internal electrode exposed from the side surface of the laminate,
   a shield conductor layer is provided on the outer surface of the laminate including the side surface on which the second plating layer is provided, and
   a thickness of the second plating layer is less than a thickness of the shield conductor layer, and
   wherein, when viewing a section of the laminate divided in a laminating direction of the substrate layers, the section including an exposed portion of the internal electrode on the side surface of the laminate, the second plating layer has an inner side in contact with the side surface of the laminate, and a length of the inner side is more than a thickness of the internal electrode.

2. The laminated electronic component according to claim 1, wherein a coil and a capacitor are provided inside the laminate to constitute an LC filter.

3. The laminated electronic component according to claim 1, wherein
the length of the inner side is 1.5 times or more of the thickness of the internal electrode.

4. The laminated electronic component according to claim 3, wherein, when viewing the section,
an outer edge of a section of the second plating layer includes the inner side in contact with the side surface of the laminate, an outer side opposite to the inner side, and a first connecting side and a second connecting side connecting the inner side with the outer side, and
an interior angle between the inner side and the first connecting side and an interior angle between the inner side and the second connecting side are each smaller than 90°.

5. The laminated electronic component according to claim 3 further comprising an extended electrode having one end connected to the internal electrode and another end exposed from the side surface of the laminate.

6. The laminated electronic component according to claim 1, wherein, when viewing the section,
an outer edge of a section of the second plating layer includes the inner side in contact with the side surface of the laminate, an outer side opposite to the inner side, and a first connecting side and a second connecting side connecting the inner side with the outer side, and
an interior angle between the inner side and the first connecting side and an interior angle between the inner side and the second connecting side are each smaller than 90°.

7. The laminated electronic component according to claim 6 further comprising an extended electrode having one end connected to the internal electrode and another end exposed from the side surface of the laminate.

8. The laminated electronic component according to claim 6, wherein the interior angle between the inner side and the first connecting side and the interior angle between the inner side and the second connecting side are each smaller than 60°.

9. The laminated electronic component according to claim 8 further comprising an extended electrode having one end connected to the internal electrode and another end exposed from the side surface of the laminate.

10. The laminated electronic component according to claim 1, wherein the shield conductor layer is composed of a plurality of layers.

11. The laminated electronic component according to claim 1, further comprising an extended electrode having one end connected to the internal electrode and another end exposed from the side surface of the laminate.

12. A method for manufacturing the laminated electronic component according to claim 1, comprising:
a step of preparing ceramic green sheets;
a step of forming a through hole for forming a via conductor in a predetermined one of the ceramic green sheets and filling the through hole with a conductive paste;
a step of applying a conductive paste in a predetermined shape to form at least one of the internal electrode and the external electrode on a main surface of a predetermined one of the ceramic green sheets;
a step of stacking the ceramic green sheets to produce an unfired laminate;
a step of firing the unfired laminate with a predetermined profile to produce the laminate having the outer surface including the first main surface, the second main surface, and the at least one side surface connecting the first main surface and the second main surface, the internal electrode formed inside, and the external electrode formed on the first main surface or the second main surface, the internal electrode having the end portion exposed from the side surface to an outside;
a step of forming the first plating layer on the external electrode and forming the second plating layer on the side surface of the laminate to cover the end portion of the internal electrode exposed from the side surface of the laminate;
a step of flattening the second plating layer by a barrel apparatus; and
a step of forming the shield conductor layer on the outer surface of the laminate including the second plating layer.

13. The method for manufacturing a laminated electronic component according to claim 12, wherein the step of forming the shield conductor layer is a step of sputtering on a predetermined portion of the outer surface of the laminate.

14. The laminated electronic component according to claim 1, wherein the internal electrode is a ground electrode.

15. The laminated electronic component according to claim 1, wherein the internal electrode has a plurality of end portions exposed from the side surface.

16. The laminated electronic component according to claim 1, wherein the second plating layer is composed of a plurality of layers.

* * * * *